United States Patent [19]

Tanaka et al.

[11] Patent Number: 4,970,694
[45] Date of Patent: Nov. 13, 1990

[54] CHIP ENABLE INPUT CIRCUIT IN SEMICONDUCTOR MEMORY DEVICE

[75] Inventors: Hiroaki Tanaka; Naokazu Miyawaki, both of Yokohama, Japan

[73] Assignee: Kabushiki Kaisha Toshiba, Kawasaki, Japan

[21] Appl. No.: 351,231

[22] Filed: May 12, 1989

[30] Foreign Application Priority Data

May 16, 1988 [JP] Japan .................................. 63-118468

[51] Int. Cl.$^5$ .............................................. G11C 11/34
[52] U.S. Cl. ............................... 365/233; 365/230.06; 365/230.08
[58] Field of Search ....................... 365/189.07, 230.06, 365/230.08, 233

[56] References Cited

U.S. PATENT DOCUMENTS 4,679,173 7/1987 Sato ...................................... 365/233

OTHER PUBLICATIONS

IC Technical Data, Toshiba MOS Memory 8th Edition, 1986, Kabushiki Kaisha Toshiba, P361–368.

*Primary Examiner*—Joseph A. Popek
*Attorney, Agent, or Firm*—Finnegan, Henderson, Farabow, Garrett, and Dunner

[57] ABSTRACT

A first chip enable signal for determining the operation timing of a memory chip is supplied to a first chip enable input circuit. A second chip enable signal for selectively specifying the stand-by mode/operative mode of the memory chip and an output signal of the first chip enable input circuit are supplied to a second chip enable input circuit. The second chip enable signal is received and latched by means of the second chip enable input circuit when the first chip enable signal is set active. An internal chip enable signal is output from the second chip enable input circuit based on the latched output to set the internal circuit of the memory chip into the stand-by mode.

23 Claims, 5 Drawing Sheets

CHIP ENABLE INPUT CIRCUIT IN SEMICONDUCTOR MEMORY DEVICE

BACKGROUND OF THE INVENTION

1. Field of the Invention

This invention relates to a semiconductor memory device, and more particularly to a circuit for reducing the power consumption in the stand-by mode for the operation of a memory integrated circuit chip.

2. Description of the related art

Figure 1:
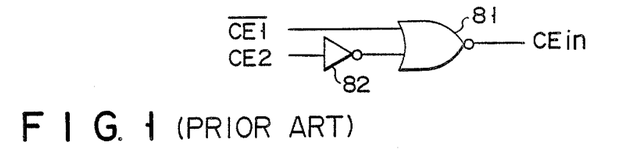
FIG. 1 is a circuit diagram showing a chip enable input circuit in the conventional SRAM.

In an integrated circuit of the conventional static random access memory (SRAM), for example, negative logic signal CE1 and positive logic signal CE2 for selectively specifying a stand-by mode/operative mode of the chip are used as a chip enable signal. Signals CE1 and CE2 are supplied to a chip enable input circuit as is shown in FIG. 1. Signal CE1 is supplied to one input terminal of NOR gate 81 and signal CE2 is inverted by inverter 82 and then supplied to the other input terminal of NOR gate 81. The output of NOR gate 81 is used as internal chip enable signal CEin.

Figure 2:
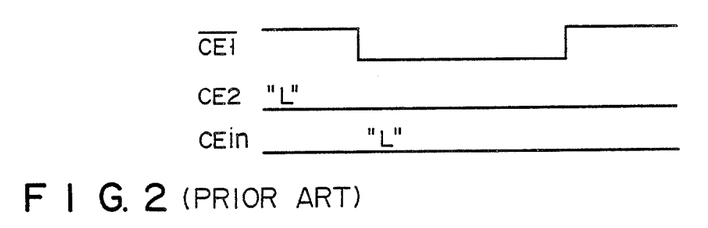
FIGS. 2 and 3 are timing charts for illustration the operation of the circuit shown in FIG. 1.
Figure 3:
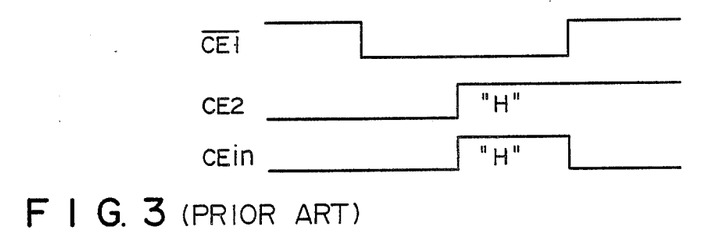

In a case where signal CE2 is set at a low level ("L") as shown in FIG. 2, signal CEin is kept at a low level even if signal CE1 becomes active (low level). As a result, the internal circuit of the chip is set into the stand-by mode and the power consumption is suppressed to a minimum.

In contrast, when signal CE2 becomes active (high level "H") while signal CE1 is kept at the active level, signal CEin becomes high level and the circuit in the chip becomes operative. Therefore, it becomes necessary to hold signal CE2 at a low level while signal CE1 is kept at the low level in order to suppress the power consumption in the stand-by mode of the chip. For this reason, the condition of signal CE2 will be limited.

Figure 4A:
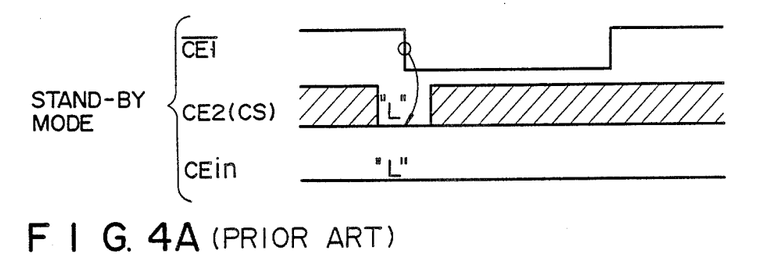
FIGS. 4A and 4B are timing charts in the case of the stand-by mode and operative mode in the conventional method in which a second chip enable signal is interrupted at the time of fall of a first chip enable signal.
Figure 4B:
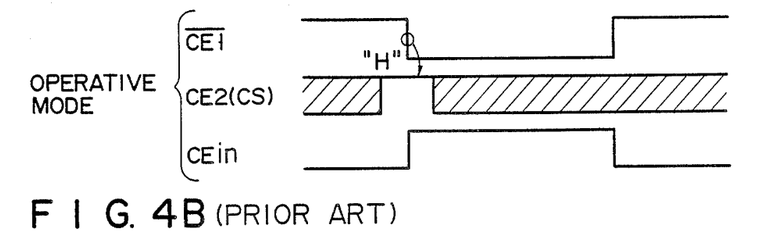

In order to eliminate the above limitation, a method in which signal CE2 (chip select signal CS) is taken into the internal circuit in synchronism only with the fall of signal CE1 as shown in FIGS. 4A and 4B is proposed. If signal CE2 is at a low level when taken into the internal circuit, the internal circuit is set into the stand-by mode by the low level of signal CEin (FIG. 4A), and if signal CE2 is at a high level, the internal circuit is set into the operative mode by the high level of signal CEin (FIG. 4B). In this way, signal CE2 is limited only at the time of fall of signal CE1, and is free in other period of time indicated by a hatched portion. However, in the stand-by mode shown in FIG. 4A, it becomes necessary to set the internal circuit operative in order to receive signal CE2 at the time of fall of signal CE1. Thus, if the internal circuit is operated, the power consumption increases.

It is also effected to set the data output buffer into the stand-by mode by output enable signal OE in order to suppress the power consumption of the internal circuit in the stand-by mode. However, even when the power consumption in the output stage is suppressed, the power consumption of the whole circuit cannot be sufficiently suppressed since other circuit portions of the internal circuit are operated.

As described above, in a case where the stand-by mode/operative mode of the internal circuit of the chip is controlled by two kinds of chip enable signals, the power consumption will be increased by taking the chip enable signal in the stand-by mode even if it is so designed that one of the two chip enable signals may be set normally free and will be limited only when the other chip enable signal is set active.

SUMMARY OF THE INVENTION

An object of this invention is to provide a semiconductor memory device in which the stand-by mode/operative mode of the internal circuit of the chip is controlled by two kinds of chip enable signals, the degree of freedom of one of the chip enable signals can be increased and the power consumption in the standby mode can be sufficiently reduced.

The above object can be attained by a semiconductor memory device comprising a first chip enable input circuit for receiving a first chip enable signal for specifying the operation timing of a memory chip and outputting a control signal; and a second chip enable input circuit supplied with a second chip enable signal for selectively specifying the stand-by mode/operative mode of the memory chip, for receiving and latching the second chip enable signal when the first chip enable signal is set active, and outputting an internal chip enable signal based on the latched output to set an internal circuit of the memory chip into the stand-by mode.

With the above construction, the second chip enable signal is limited only when the first chip enable signal is set active, and is set free at other period of time. Therefore, the memory chip can be more freely and effectively used. Further, since the operation of internal circuits connected at the latter stage of the circuit which receives the internal chip enable signal in the stand-by mode is interrupted, the power consumption can be significantly reduced.

Thus, a semiconductor memory device can be obtained in which the stand-by mode/operative mode of the internal circuit of the chip is controlled by two kinds of chip enable signals, the degree of freedom of one of the chip enable signals can be increased and the power consumption in the stand-by mode can be significantly reduced.

DETAILED DESCRIPTION OF THE PREFERRED EMBODIMENTS

Figure 5:
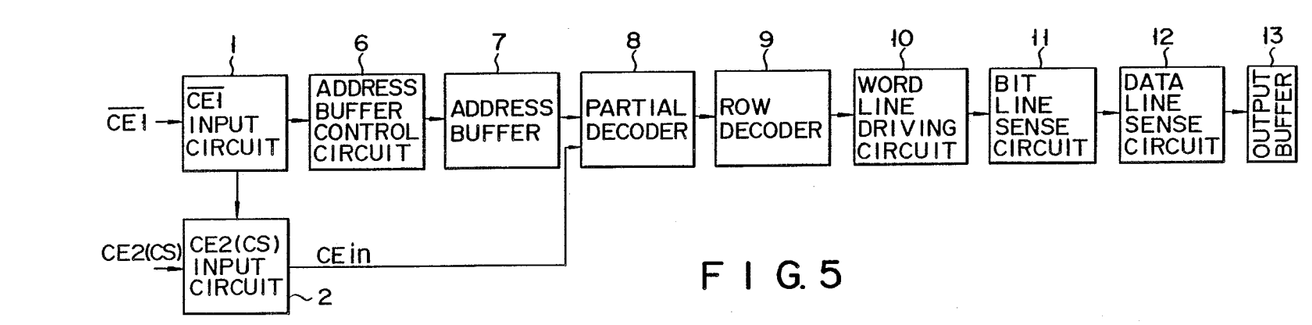
FIG. 5 is a block diagram showing an SRAM according to one embodiment of this invention.

In FIG. 5, a chip enable input circuit of an SRAM according to one embodiment of this invention and an internal circuit whose stand-by mode/operative mode is controlled by the output of the input circuit are shown according to the flow of a control signal. The chip enable input circuit includes first chip enable input circuit CE1 input circuit) 1 and second chip enable input circuit (CE2 input circuit) 2. Second chip enable input circuit 2 is externally supplied with positive logic signal CE2 (chip select signal CS) for selectively specifying the stand-by mode/operative mode of the chip. First chip enable input circuit 1 is externally supplied with first chip enable signal CE1 of negative logic for specifying the timing at which signal CE2 is received. Second chip enable input circuit 2 is controlled by the output of first chip enable input circuit 1 to output internal chip enable signal CEin. The internal circuit is selectively set in the stand-by mode or operative mode according to signal CEin. The internal circuit includes address buffer control circuit 6, address buffer 7, partial decoder 8, row decoder 9, word line driving circuit 10, bit line sense circuit 11, data line sense circuit 12 and output buffer 13. Partial decoder 8 is used to suppress increase in the size of the hardware of row decoder 9 caused by increase in the capacitance of the memory device, and functions to pre-decode part of the row address. In the normal access operation, the above circuits sequentially perform their functions. The circuits succeeding partial decoder 8 are selectively set into the stand-by mode or operative mode by signal CEin output from CE2 input circuit 2.

Figure 6:
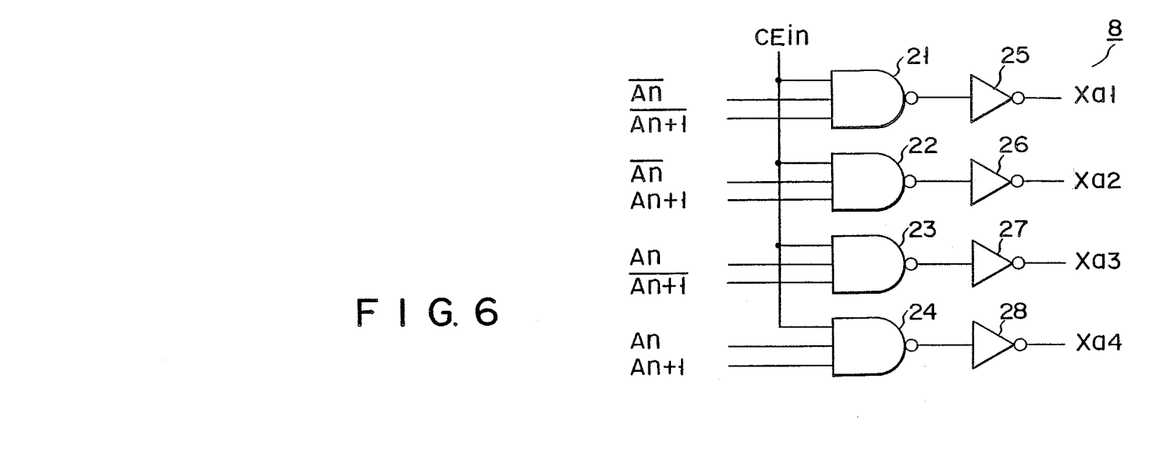
FIG. 6 is a logic circuit diagram showing the construction of a partial decoder in the circuit of FIG. 5.

FIG. 6 shows the circuit construction of partial decoder 8. Partial decoder 8 includes pre-decoding NAND gates 21 to 24 and inverters 25 to 28. Pre-decoding NAND gates 21 to 24 are each supplied with a specified combination of two of address signals An, An+1, An and An+1, and signal CEin. The outputs of NAND gates 21 to 24 are respectively supplied to inverters 25 to 28 whose outputs Xa1 to Xa4 are in turn supplied to row decoder 9.

Figure 7:
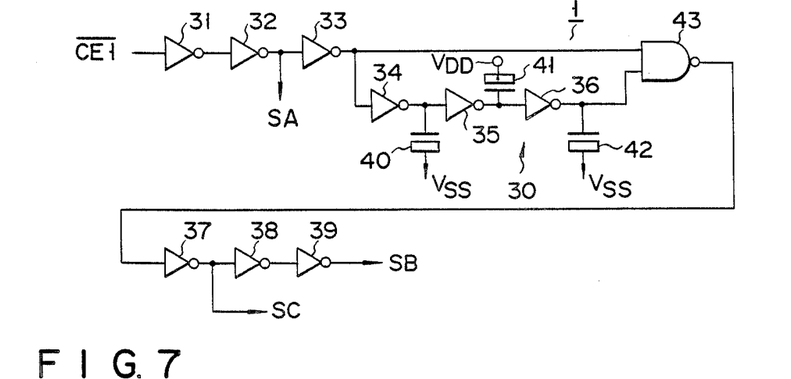
FIG. 7 is a circuit diagram showing the construction of a first chip enable input circuit in the circuit of FIG. 5.

First chip enable input circuit CE1 input circuit) 1 includes CMOS inverters 31 to 39, MOS capacitors 40 to 42, and CMOS NAND gate 43 as shown in FIG. 7, for example. Signal CE1 is supplied to one input terminal of NAND gate 43 via inverters 31 to 33. Control signal SA output from inverter 32 is supplied to address buffer control circuit 6 and second chip enable circuit 2. The output of inverter 33 is supplied to the other input terminal of NAND gate 43 via delay circuit 30 formed of inverters 34 to 36 and capacitors 40 to 42. The output of NAND gate 43 is supplied to second chip enable circuit 2 via inverters 37 to 39. The output of inverter 39 is represented by control signal SB and the output of inverter 37 is represented by control signal SC.

Figure 8:
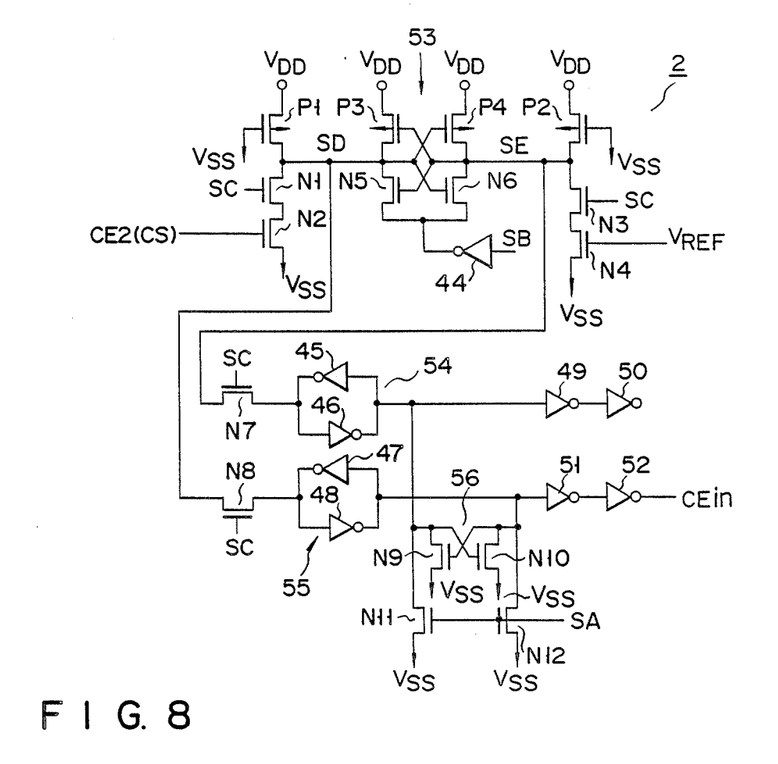
FIG. 8 is a circuit diagram showing the construction of a second chip enable input circuit in the circuit of FIG. 5.

Second chip enable circuit (CE2 input circuit) 2 includes P-channel MOS transistors P1 to P4, N-channel MOS transistors N1 to N12, and CMOS inverters 44 to 52 as shown in FIG. 8, for example. The current paths of transistors P1, N1 and N2 are serially connected between power source terminal $V_{DD}$ and ground potential terminal (ground terminal) $V_{SS}$. Likewise, the current paths of transistors P2, N3 and N4 are serially connected between power source terminal $V_{DD}$ and potential terminal (ground terminal) $V_{SS}$. The gates of transistors P1 and P2 are grounded and the gates of transistors N1 and N3 are supplied with control signal SC output from first chip enable circuit 1. Further, the gates of transistors N2 and N4 are respectively supplied with signal CE2 and reference potential $V_{REF}$. The drains of transistors P1 and P2 are connected to the differential input terminals (differential output terminals) of CMOS differential amplifier circuit 53. Differential amplifier circuit 53 includes transistors P3 and N5 constituting a first CMOS inverter and transistors P4 and N6 constituting a second CMOS inverter. The input and output terminals of the first inverter are respectively connected to the output and input terminals of the second inverter. The reference potential terminal (common connection node between the sources of transistors N5 and N6) of differential amplifier circuit 53 is connected to the output terminal of inverter 44 whose input terminal is supplied with control signal SB. Differential output signals (represented by signals SD and SE) of differential amplifier circuit 53 are respectively supplied to one-ends of the current paths of transistors N7 and N8. The gates of transistors N7 and N8 are supplied with control signal SC. The other ends of the current paths of transistors N7 and N8 are respectively connected to the input terminals of latch circuits 54 and 55. Latch circuit 54 is constituted by respectively connecting the output and input terminals of inverter 45 to the input and output terminals of inverter 46. Likewise, latch circuit 55 is constituted by respectively connecting the output and input terminals of inverter 47 to the input and output terminals of inverter 48. The output terminal of latch circuit 54 is connected to the input terminal of inverter 49 whose output terminal is connected to the input terminal of inverter 50. The output terminal of latch circuit 55 is connected to the input terminal of inverter 51 whose output terminal is connected to the input terminal of inverter 52. The output terminal of inverter 50 is set in the electrically floating condition, and internal chip enable signal CEin is output from the output terminal of inverter 52. Transistor N7, latch circuit 54 and inverters 49 and 50 are dummy elements to match the load capacitances of the input terminals of differential amplifier circuit 53. The current paths of transistors N11 and N12 acting as ground-shorting switches are connected between the ground terminal and the output terminals of latch circuits 54 and 55, and the gates of transistors N11 and N12 are supplied with control signal SA. Further, pull-down circuit 56 constituted by transistors N9 and N10 is connected between the ground terminal and the output terminals of latch circuits 54 and 55. The drain of transistor N9 is connected to the output terminal of latch circuit 54, the source thereof is grounded and the gate thereof is connected to the output terminal of latch circuit 55. The drain of transistor N10 is connected to the output terminal of latch circuit 55, the source thereof is grounded and the gate thereof is connected to the output terminal of latch circuit 54. Transistors N11 and N12 constitute a reset circuit for latch circuits 54 and 55.

There will now be described the operation of first and second chip enable input circuits 1 and 2. When signal CE1 is at "1" (nonactive) level, control signal SA is set at "1" level and transistors N11 and N12 are set in the conductive state. As a result, signal CE in is set at "0" level. When signal CE1 is set to "0" (active) level, signal SA is set to "0" level and transistors N11 and N12 are turned off. In the delay time of delay circuit 30 has elapsed, control signals SC and SB are set to "1" level and second chip enable circuit 2 is activated. At this time, if signal CE2 is lower than reference potential VREF, differential output signals SD and SE are set to "1" and "0" levels, respectively. Signal SD is latched by latch circuit 55 and signal CEin is set to "0" level. In contrast, if signal CE2 is higher than reference potential VREF, differential output signals SD and SE are set to "0" and "1" levels, respectively and signal CEin is set to "1" level.

Figure 9A:
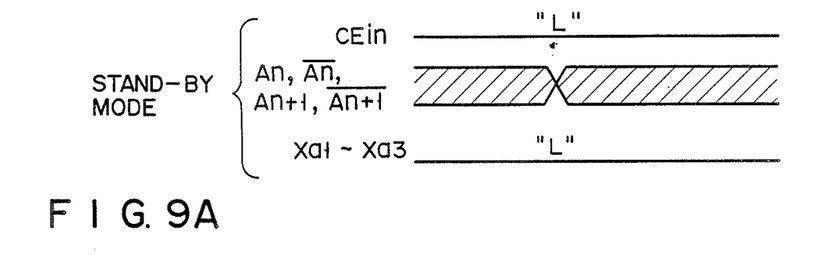
FIGS. 9A and 9B are timing charts in the case of the stand-by mode and operative mode in the circuit of FIG. 5.
Figure 9B:
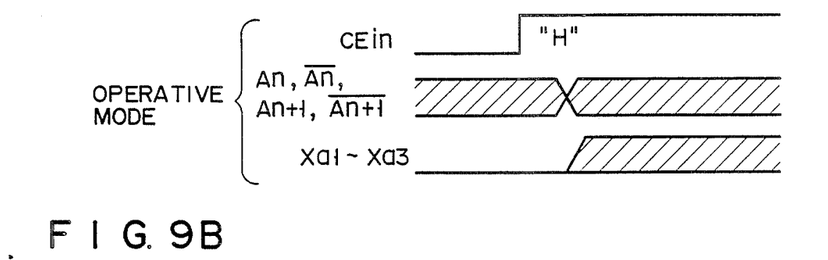

Next, the chip enable control operation in the SRAM shown in FIGS. 5 and 6 is explained with reference to FIGS. 9A and 9B. When signal CE1 is set active (falls) while signal CE2 is at low level "L", signal CEin is kept at the initial level or low level. In the stand-by state, outputs Xa1 to Xa4 of partial decoder 8 are kept unchanged even when outputs An, An+1, An and An+1 of address buffer 7 are changed. Therefore, circuits connected in the latter stage of partial decoder 8 in the internal circuit of FIG. 5, that is, row decoder 9, word line driving circuit 10, bit line sense circuit 11, data line sense circuit 12 and output buffer circuit 13 are not operated. As a result, the power consumption can be significantly reduced.

In contrast, when signal CE1 is activated while signal CE2 is kept at high level "H", signal CEin is changed from the low level to the high level. In this condition, when the outputs of address buffer 7 are changed, outputs Xa1 to Xa4 of partial decoder 8 are also changed. As a result, the circuits at the succeeding stage of partial decoder 8 are set into the operative condition.

Figure 10:
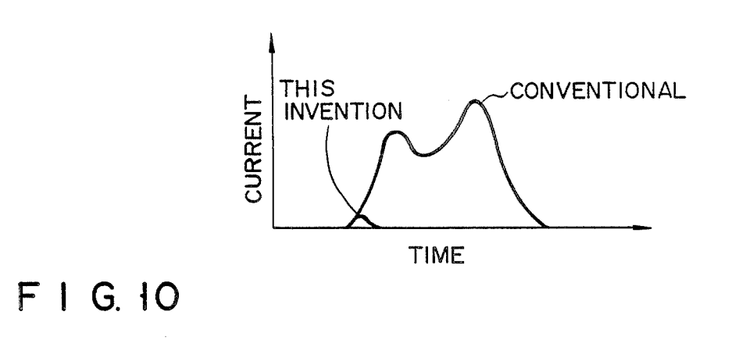
FIG. 10 is a diagram showing the power consumption in the conventional circuit and that in the circuit of FIG. 5 in which the second chip enable signal becomes active after the first chip enable signal is activated.

With the above SRAM, it is only when signal CE1 falls that signal CE2 is limited, and therefore the degree of freedom of the signal can be increased, causing the SRAM to be more simply and effectively used. Further, when signal CE2 is changed from the low level to high level after signal CE1 has fallen, signal CEin is kept unchanged, preventing the circuits at the latter stage of partial decoder 8 from being unnecessarily operated. The current consumption occurring in this case is shown in FIG. 10 in comparison with that in the conventional SRAM. As is clearly seen from FIG. 10, with the construction of this embodiment, the power consumption in the stand-by mode can be significantly reduced.

Figure 11:
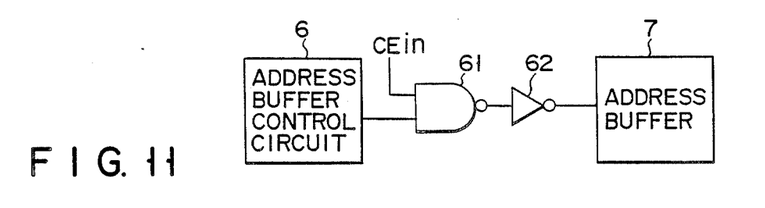
FIG. 11 is a circuit diagram for illustrating the case wherein the output of an address buffer control circuit in the circuit of FIG. 5 is controlled by the internal chip enable signal.

In the above embodiment, partial decoder 8 is controlled by use of internal chip enable signal CEin output from CE2 input circuit 2. However, when it is not strongly necessary to enhance the access speed, it is possible to control address buffer control circuit 6 or address buffer 7 by use of output signal CEin of CE2 input circuit 2. FIG. 11 shows a circuit construction in which address buffer control circuit 6 is controlled by signal CEin. The output terminal of address buffer control circuit 6 is connected to inverter 62 via NAND gate 61. That is, the output of address buffer control circuit 6 is supplied to one input terminal of NAND gate 61 which receives signal CEin at the other input terminal, and the output of NAND gate 61 is supplied to address buffer 7 via inverter 62.

Figure 12:
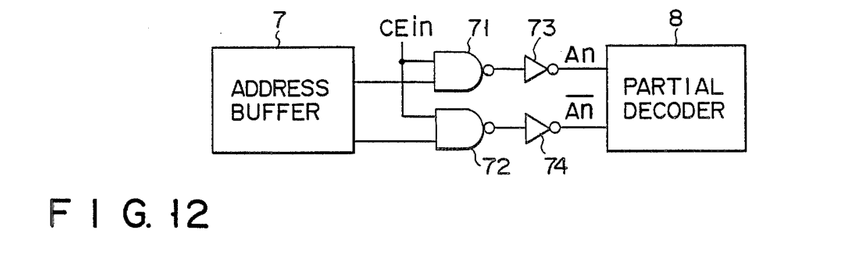
FIG. 12 is a circuit diagram for illustrating the case wherein the output of an address buffer in the circuit of FIG. 5 is controlled by the internal chip enable signal.

FIG. 12 shows a circuit construction in which address buffer 7 is controlled by signal CEin. In FIG. 12, one of a plurality of bit-data of the outputs of address buffer 7 is typically shown. The outputs of address buffer 7 are connected to inverters 73 and 74 via NAND gates 71 and 71. NAND gates 71 and 72 are supplied with the respective outputs of address buffer 7 at one input terminal and signal CEin at the other input terminal. The outputs of NAND gates 71 and 72 are supplied to partial decoder 7 via inverters 73 and 74.

As described above, the operation of the circuits at the latter stage of address buffer control circuit 6 or address buffer 7 can be interrupted in the stand-by mode by controlling address buffer control circuit 6 or address buffer 7 by use of signal CEin. Thus, the power consumption can be further reduced in comparison with the circuit of FIG. 5.

Figure 13:
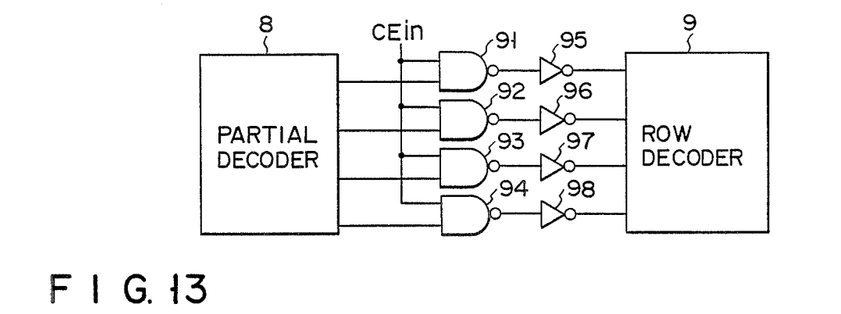
FIG. 13 is a circuit diagram for illustrating the case wherein the output of a partial decoder in the circuit of FIG. 5 is controlled by the internal chip enable signal.
Figure 14:
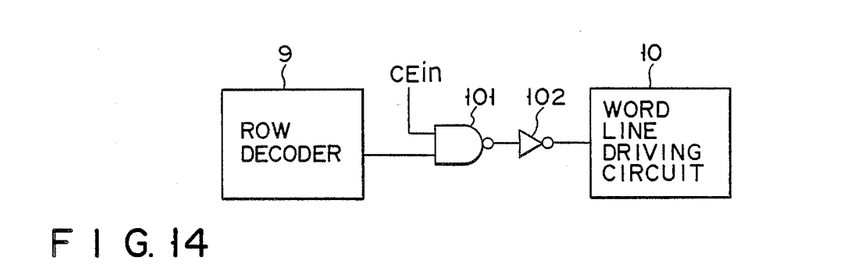
FIG. 14 is a circuit diagram for illustrating the case wherein the output of a row decoder in the circuit of FIG. 5 is controlled by the internal chip enable signal.
Figure 15:
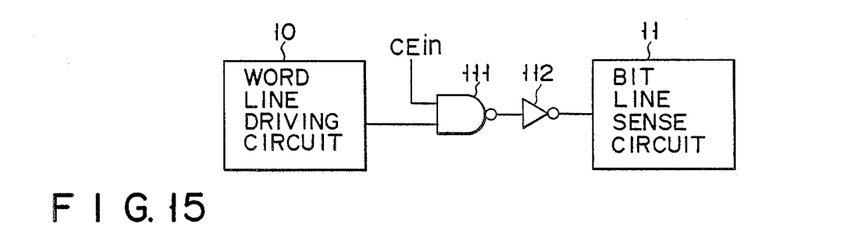
FIG. 15 is a circuit diagram for illustrating the case wherein the output of a word line driving circuit in the circuit of FIG. 5 is controlled by the internal chip enable signal.

Also, it is possible to control partial decoder 8, row decoder 9 or word line driving circuit 10 by use of internal chip enable signal CEin output from CE2 input circuit 2 as shown in FIGS. 13 to 15. FIG. 13 shows a circuit construction in which the outputs of partial decoder 8 are controlled by signal CEin. In FIG. 13, two of a plurality of bit-data of the outputs of partial decoder 8 are typically shown. The outputs of partial decoder 8 are connected to inverters 95 to 98 via NAND gates 91 to 94. NAND gates 91 to 94 are supplied with the respective outputs of partial decoder 8 at one input terminal and signal CEin at the other input terminal. The outputs of NAND gates 91 to 94 are supplied to row decoder 9 via inverters 95 to 98.

FIG. 14 shows a circuit construction in which the outputs of row decoder 9 are controller by signal CEin. Some of the outputs of row decoder 9 can be used to control word line driving circuit 10. In FIG. 14, only one of the control output is shown. The outputs of row decoder 9 is connected to inverter 102 via NAND gate 101. NAND gate 101 is supplied with the output of row decoder 9 at one input terminal and signal CEin at the other input terminal. The output of NAND gate 101 is supplied to word line driving circuit 10 via inverter 102.

In a case where word line driving circuit 10 is controlled by signal CEin, the outputs of word line driving circuit 10 are connected to inverter 112 via NAND gate 111. NAND gate 111 is supplied with the output of word line driving circuit 10 at one input terminal and signal CEin at the other input terminal. The output of NAND gate 111 is supplied to bit line sense circuit 11 via inverter 112.

As described above, the operation of the circuits at the latter stage of partial decoder 8, row decoder 9 or word line driving circuit 10 can be interrupted in the stand-by mode by respectively controlling the outputs of partial decoder 8, row decoder 9 or word line driving circuit 10 by use of signal CEin. Thus, the power consumption can be further reduced in comparison with the conventional circuit.

As described above, according to the semiconductor memory device of this invention, in a case where two kinds of chip enable signals are used to control the stand-by mode/operative mode of the circuits in the chip, one of the chip enable signals is limited only when the other chip enable signal is set active, and can be made free at the other time, causing the memory device to be simply and effectively used. Further, since the operation of the internal circuits at the latter stage of the circuit to which the internal chip enable signal is supplied can be interrupted, the power consumption of the memory device can be reduced.

What is claimed is:

1. A semiconductor memory device comprising: first chip enable input means for receiving a first chip enable signal for enabling the operation of a memory chip and outputting a control signal; and second chip enable input means for receiving a second chip enable signal for specifying either a stand-by mode or operative mode of the operation of the memory chip, said second chip enable input means receiving and latching the second chip enable signal at times when the first ship enable signal is set active and outputting an internal chip enable signal based on the second chip enable signal as latched to set an internal circuit of the memory chip to the stand-by mode.

2. A semiconductor memory device according to claim 1, wherein said first chip enable input means includes an input circuit for receiving the first chip enable signal and outputting a first control signal; pulse generating means for generating a pulse signal with a preset pulse width based on the output of said input circuit; and an output circuit for outputting second and third control signals based on output signals of said pulse generating means.

3. A semiconductor memory device according to claim 2, wherein said input circuit includes a first inverter for receiving the first chip enable signal and a second inverter for receiving an output of said first inverter and outputting the first control signal.

4. A semiconductor memory device according to claim 2, wherein said pulse generating means includes a first inverter for receiving the output signal of said input circuit; delay means for receiving an output signal of said first inverter; and logic means for deriving an output signal corresponding to the negative logic product of the output signal of said first inverter and an output signal of delay means.

5. A semiconductor memory device according to claim 4, wherein said delay means includes a plurality of cascade-connected inverters; and capacitors respectively connected between the output terminals of said inverters and a potential supplying source.

6. A semiconductor memory device according to claim 4, wherein said logic means includes a NAND gate.

7. A semiconductor memory device according to claim 2, wherein said output circuit includes a first inverter for receiving the output of said pulse generating means and outputting the second control signal; a second inverter for receiving the output of said first inverter and a third inverter for receiving an output signal of said second inverter and outputting the third control signal.

8. A semiconductor memory device according to claim 1, wherein said second chip enable input means includes differential amplifier means for receiving the second chip enable signal and a reference potential, the operation thereof being controlled by the second control signal from said first chip enable input means; latching means for latching an output signal of said differential amplifier means according to the third control signal output from said first chip enable input means; and reset means for resetting said latching means according to the first control signal output from said first chip enable input means.

9. A semiconductor memory device according to claim 8, wherein said differential amplifier means includes a first MOS transistor of a first conductivity type whose current path is connected at one end to a first potential supplying source and whose gate is connected to a second potential supplying source; a second MOS transistor of a second conductivity type whose current path is connected at one end to the other end of the current path of said first MOS transistor and whose gate is supplied with the second control signal output from said first chip enable input means; a third MOS transistor of the second conductivity type whose current path is connected between the other end of the current path of said second MOS transistor and said second potential supplying source and whose gate is supplied with the second chip enable signal; a fourth MOS transistor of the first conductivity type whose current path is connected at one end to said first potential supplying source and whose gate is connected to said second potential supplying source; a fifth MOS transistor of the second conductivity type whose current path is connected at one end to the other end of the current path of said fourth MOS transistor and whose gate is supplied with the second control signal output from said first chip enable input means; a sixth MOS transistor of the second conductivity type whose current path is connected between the other end of the current path of said fifth MOS transistor and said second potential supplying source and whose gate is supplied with the reference potential; a seventh MOS transistor of the first conductivity type whose current path is connected at one end to said first potential supplying source and at the other end to a connection node between said first and second MOS transistors and whose gate is connected to a connection node between said fourth and fifth MOS transistors; an eighth MOS transistor of the second conductivity type whose current path is connected at one end to the connection node between said first and second MOS transistors and whose gate is connected to the connection node between said fourth and fifth MOS transistors; a ninth MOS transistor of the first conductivity type whose current path is connected at one end to said first potential supplying source and connected at the other end to the connection node between said fourth fifth MOS transistors and whose gate is connected to the connection node between said first and second MOS transistors; a tenth MOS transistor of the second conductivity type whose current path is connected at one end to the connection node between said fourth and fifth MOS transistors and whose gate is connected to the connection node between said first and second MOS transistors; and an inverter whose input terminal is supplied with the third control signal output from said first chip enable input means and whose output terminal is connected to the other ends of the current paths of said eighth and tenth MOS transistors.

10. A semiconductor memory device according to claim 8, wherein said latching means includes a first MOS transistor having a current path whose one end is supplied with a first output signal of said differential amplifier means and whose gate is supplied with the second control signal output from said first chip enable input means; a first latch circuit having an input terminal connected to the other end of the current path of said first MOS transistor; a first inverter having an input terminal connected to the output terminal of said first latch circuit; a second inverter having an input terminal connected to the output terminal of said first inverter; a second MOS transistor having a current path whose one end is supplied with a second output signal of said differential amplifier means and whose gate is supplied with the second control signal output from said first chip enable input means; a second latch circuit having an input terminal connected to the other end of the current path of said second MOS transistor; a third inverter having an input terminal connected to the output terminal of said second latch circuit; a fourth inverter having an input terminal connected to the output terminal of said third inverter and an output terminal from which the internal chip enable signal is output; a third MOS transistor having a current path whose one end is supplied with the latched output of said first latch circuit and connected at the other end to said second potential supplying source and whose gate is supplied with an output signal of said second latch circuit; and a fourth MOS transistor having a current path whose one end is supplied with a latched output of said second latch circuit and connected at the other end to said second potential supplying source and whose gate is supplied with the output signal of said first latch circuit.

11. A semiconductor memory device according to claim 10, wherein each of said first and second latch circuits includes a first inverter having input and output terminals; and a second inverter having an input terminal connected to the output terminal of said first inverter, and having an output terminal connected to the input terminal of said first inverter.

12. A semiconductor memory device according to claim 11, wherein said reset means includes a first MOS transistor having a current path whose one end is supplied with a latched output of said first latch circuit and connected at the other end to said second potential supplying source and whose gate is supplied with the first control signal output from said first chip enable input means; and a second MOS transistor having a current path whose one end is supplied with a latched output of said second latch circuit and connected at the other end to said second potential supplying source and whose gate is supplied with the first control signal output from said first chip enable input means.

13. A semiconductor memory device according to claim 1, wherein the internal circuit of said memory chip includes a partial decoder.

14. A semiconductor memory device according to claim 13, wherein said partial decoder includes a plurality of NAND gates supplied with address signals and the output signal of said second chip enable input means; and a plurality of inverters having input terminals respectively connected to output terminals of said NAND gates.

15. A semiconductor memory device according to claim 13, further comprising a plurality of NAND gates supplied with an output signal of said partial decoder at one input terminal and the output signal of said second chip enable input means at the other input terminal; and a plurality of inverters connected to output terminals of said NAND gates.

16. A semiconductor memory device according to claim 1, wherein the internal circuit of said memory chip includes an address buffer control circuit.

17. A semiconductor memory device according to claim 16, further comprising a NAND gate supplied with an output signal of said address buffer control circuit at one input terminal and the output signal of said second chip enable input means at the other input terminal; and an inverter connected to an output terminal of said NAND gate.

18. A semiconductor memory device according to claim 1, wherein the internal circuit of said memory chip includes an address buffer.

19. A semiconductor memory device according to claim 18, further comprising a plurality of NAND gates supplied with an output signal of said address buffer at one input terminal and the output signal of said second chip enable input means at the other input terminal; and a plurality of inverters connected to output terminals of said NAND gates.

20. A semiconductor memory device according to claim 1, wherein the internal circuit of said memory chip includes a row decoder.

21. A semiconductor memory device according to claim 20, further comprising a NAND gate supplied with an output signal of said row decoder at one input terminal and the output signal of said second chip enable input means at the other input terminal; and an inverter connected to an output terminal of said NAND gate.

22. A semiconductor memory device according to claim 1, wherein the internal circuit of said memory chip includes a word line driving circuit.

23. A semiconductor memory device according to claim 22, further comprising a NAND gate supplied an output signal of said word line driving circuit at one input terminal and the output signal of said second chip enable input means at the other input terminal; and an inverter connected to an output terminal of said NAND gate.

* * * * *